Dec. 1, 1959 W. D. CAMPBELL 2,915,729

FLUID COOLED ELECTRICAL APPARATUS

Filed July 31, 1957

INVENTOR.
WILLIAM D. CAMPBELL

BY J. F. McLellan

ATTORNEY

④ United States Patent Office 2,915,729

Patented Dec. 1, 1959

2,915,729

FLUID COOLED ELECTRICAL APPARATUS

William D. Campbell, San Diego, Calif.

Application July 31, 1957, Serial No. 675,465

2 Claims. (Cl. 338—231)

The present invention relates to fluid cooled electrical apparatus, and more particularly relates to fluid cooled electrical apparatus which is hermetically sealed and which is primarily adapted for association with electronic equipment such as that which includes a chassis or other mounting means for electrical and electronic components.

In the use of resistors, coils or inductors, and similar components in electrical and electronic circuits, it is often desirable to establish and maintain a precise electrical resistance value for such components so that, for example, the behavior of the electrical circuit will be substantially the same throughout the various conditions of operation to which the electrical or electronic equipment is subjected. However, the value of such resistances or resistors changes with temperature, and therefore it becomes necessary to reduce the temperature to an acceptable value to permit accurate functioning of the resistors. Since it is the common and accepted practice in the electronics industry to effect cooling of such resistances merely by exposing them to the ambient atmosphere, the size of such resistors becomes undesirably large when effectively cooled, since the cooling surface area of the resistance wire will have to be large enough to correspond with the temperature rises which will be experienced when the contemplated wattages are handled. That is, the degree of heat dissipation provided by the usual resistance wire is quite small, and in order for the resistance to handle higher wattages for a given rise in wire temperature it will be apparent that the surface area of the wire will have to be made adequate to pass this heat to the ambient air by radiation and convection. Quite often these circumstances have dictated a large and ungainly resistor, or a resistor whose value varies appreciably over its cycle of operation. In addition, resistors of the prior art are often prone to fail under shock, particularly the more accurate and delicately wired types, because of the inadequate provision of shock mounting or the like. Previously used resistors were also conventionally mounted so as to be exposed to the ambient atmosphere, and in the event that the environmental package was filled with corrosive gases or the like the lack of protection afforded the delicate windings of the resistors promoted their early failure.

Accordingly, the present invention comprises a hermetically sealed, heat dissipating resistor which is designed to rapidly dissipate heat whereby fairly high wattages may be handled without component failure. The present resistor comprises a resistance wire within a housing which is almost completely filled with cooling liquid, and which includes a conducting sleeve which functions to carry away heat generated by the flow of electrical current through the resistance. The resistance wire is resiliently mounted within the housing, thereby affording not only a high resistance to shock, but also providing for the differential expansions of the various components of the present resistor which may result from the use of different materials in such components. Moreover, it is a most important feature of the present invention that the resistor unit may be attached to an electronic component such as a chassis of a radio, television or radar set, or the like, whereby the thermal sleeve of the resistor functions to carry off heat from the resistance wire by conduction to the chassis. Thus, not only is the usual radiation and convection cooling present, but there is also provided conduction from the resistor to the chassis. The chassis is, in effect, an infinite heat "sink."

The cooling liquid in the resistor is used to provide a dielectric atmosphere for insulation between the resistance wire and the housing, and also to effect heat transfer therebetween. When the resistance wire is heated, the liquid boils and the violent agitation of the boiling action transfers heat from the wire to the housing quickly and efficiently, and without the assistance of any external or additional agency such as pumps, agitators, or the like for producing circulation of the liquid. In essence, a self-contained or unitary resistor is provided which may be easily attached to or easily detached from the chassis or similar structure of electrical and electronic apparatus whereby the resistor functions in the manner of the usual resistor, but with the improved accuracy and dependability previously described.

It is therefore an object of the present invention to provide an improved fluid cooled resistor which is adapted to handle increased wattages for a given rise in resistance wire temperature.

It is an additional object of the invention to provide a unique electrical apparatus which is hermetically sealed and which efficiently dissipates heat.

Another object of the invention is to provide a novel hermetically sealed resistor which is adapted for attachment to a heat "sink," and which embodies a liquid which will boil upon heating of the resistance wire, and will conduct such heat from the wire to the heat "sink" for dissipation.

An additional object of the invention resides in the provision of an improved fluid cooled resistor which is hermetically sealed and shock mounted to withstand rough handling and exposure to corrosive atmospheres.

A further object of the invention is to provide a unique fluid cooled resistor which internally mounts the resistance wire in a manner to provide maximum exposure of the wire to the cooling fluid.

Another object of the invention is to provide an improved fluid cooled resistor which is hermetically sealed, and which is easily manufactured and installed, and which requires substantially no maintenance.

Other objects and features of the present invention will be readily apparent to those skilled in the art from the following specification and appended drawings wherein is illustrated a preferred form of the invention, and in which:

Figure 1 is an elevational view of the resistor of the present invention, illustrating the resistor in mounted association with the metal plate of a chassis or the like;

Figure 1:
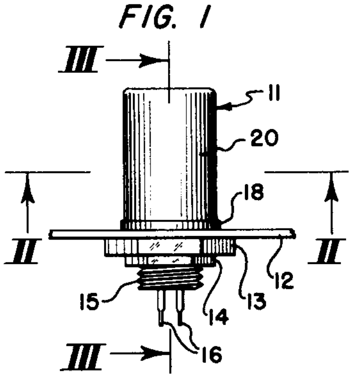

Referring to the drawings and more particularly to Figure 1, there is illustrated an embodiment of the resistor of the present invention which is generally designated 11, and which is adapted for use in connection with a variety of electrical or electronic apparatus but which is here illustrated in connection with a metal plate 12 of a chassis or the like (not shown) of well-known nature. It will be noted that resistor 11 is rigidly secured in position through a suitable opening in plate 12 by a heat conducting nut 13 and a lock nut 14, both of which are threaded upon a threaded lower portion 15 of resistor 11 which protrudes through the opening in plate 12. Nut 13 is preferably made of silver plated copper for reasons which will become apparent hereinafter.

A pair of terminals 16 are provided for accepting the usual wires (not shown) of the circuit with which resistor 11 is associated. It will be understood of course that resistor 11 is adapted for use with any electrical circuit in which the usual and well-known electrical resistors of the prior art are presently used.

Resistor 11 comprises, generally, a metallic container or sleeve 17 which carries a peripheral flange 18 for locating it in position upon plate 12. An outer housing or casing 20 is provided for housing sleeve 17 and for containing the fluid of resistor 11, and is welded or soldered to flange 18 in spaced relationship with the sides of sleeve 17. Sleeve 17, flange 18, and nut 13 are preferably of considerable mass with respect to the other components of resistor 11 so that they may easily accommodate and transfer a large heat flow from the interior of resistor 11 to the plate or heat "sink" 12. For this purpose these components are made of a material having good heat conductivity, such as copper which is silver plated in the areas of adjacency of components across which heat transfer occurs. If desired, the exterior of casing 20 may be painted black to improve its heat radiation characteristics.

Within the interior of sleeve 17 is a central core 19, made of insulating material such as ceramic or the like, and about which is wound resistance wire 21. The lower end of resistance wire 21 is connected, as by soldering, to a lower end cap 22 made of an electrically conductive material such as brass. Cap 22 is press fitted into position over the lower end of central core 19. The upper end of resistance wire 21 is soldered or otherwise connected in similar fashion to an upper end cap 23 which is fitted over the upper end of core 19 and which is also made of electrically conductive material. Thus, wire 21 completes an electrical circuit between caps 22 and 23.

A central bore 24 is provided in core 19, and within this bore 24 is disposed a wire 25, the upper end of which is electrically connected or soldered to upper cap 23. An opening 26 is provided in cap 23 through which wire 25 is disposed for attachment to cap 23. Similarly, the lower end of wire 25 is disposed through an opening 27 in lower cap 22, and wire 25 is electrically connected to the upper end of one of the terminals 16. The other terminal 16 is connected by a lead or wire 28 to lower end cap 22. In this manner the resistance circuit of resistor 11 is connected across terminals 16, which are each carried within suitable openings in the lower portion of an insulating block 29 made of a comparatively resilient material such as tetrafluoroethylene or, as it is known in the trade, "Teflon" material.

Figure 3:
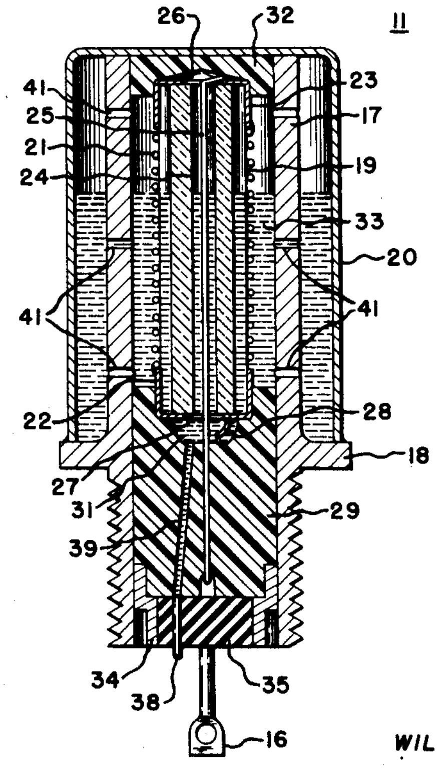
Figure 3 is a view taken along line III—III of Figure 1.

As illustrated in Figure 3, block 29 is cut away to closely fit and accommodate lower end cap 22 whereby block 29 serves to support core 19. Block 29 may be conveniently split or cut into two halves whereby the wires 25 and 28, which are disposed through block 29 and connected to terminals 16, may be grasped in the cleft between the halves and held in spaced relation so that electrical shorting therebetween is prevented. In addition, block 29 is hollowed out to provide a basin 31 for containing a portion of the liquid of resistor 11. An insulating and comparatively resilient upper block 32, of material similar to block 29, is closely fitted within the interior of sleeve 17 and is cut away to accommodate and support in position upper end cap 23. It will be readily apparent that the resilient nature of blocks 29 and 32 not only serves to support core 24 in position, but also serves to resiliently cushion the internal components of resistor 11 against shock, vibration, and rough handling. In addition, the liquid of resistor 11, designated 33, fills the greater portion, and, in any event, approximately half of the open space within casing 20, whereby a cushioning action for core 19 is provided.

The lower end of sleeve 17 is closed by a closure element 34 and by insulating material 35 to provide a hermetically sealed and unitary unit, element 34 being rigidly swaged and soldered in position, and material 35 being disposed about the upper portions of terminals 16 to fill the open lower end of element 34 as illustrated. The swaged or soldered securement of closure element 34 has been found to be sufficient to withstand the pressures developed within the interior of casing 20 during operation of resistor 11. A tube 38 is disposed through material 35, and opens to a passageway 39 provided in block 29, whereby the outer end of tube 38 is in fluid communication with basin 31. By this means liquid 33 may be injected into resistor 11 during the construction thereof, tube 38 being sealed with solder or the like when the liquid has been inserted.

Figure 2:
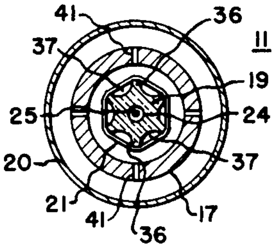
Figure 2 is a sectional view takne along line II—II of Figure 1.

To permit liquid 33 to have almost complete access to the full length of resistance wire 21 wrapped about core 19, core 19 is constructed with its periphery formed, in cross section, in star or fluted form. Thus, as best seen in Figure 2, the external periphery of core 19 is formed to provide a plurality of projections 36 and valleys 37 whereby projections 36 support resistance wire 21, and valleys 37—which run vertically—provide passage about wire 21 for liquid 33. Wire 21 is preferably held in position upon projections 36 by adhesive bonding or the like.

Although the use of a particular fluid or liquid for liquid 33 is not essential to the present invention, the characteristics of liquid fluorinated compounds are such that they are preferred. Various light oils may also be used. Such compounds are readily available on the market, and their production is known to those skilled in the art, and accordingly, no detailed description of these compounds is believed to be necessary. However, in general, the liquid chosen should have a low surface tension in order that adequate wetting of the resistance wire 21 will be afforded, and the boiling point should be sufficiently low that boiling thereof will occur upon the usual heating of the resistance wire incurred during operation of the circuit with which the wire is associated. In addition, of course, the liquid must be a dielectric, and be capable of absorption of heat from resistance wire 21 and transfer thereof to sleeving 17 of resistor 11.

The interior of casing 20 is filled with liquid 33 to a level such that substantially all of the windings of resistance wire 21 are covered, while yet allowing a sufficient space for expansion upon heating so that undesirably high pressures are not generated. The volume of such free space may be easily adjusted in accordance with the operating conditions contemplated so that where higher temperatures are encountered a greater expansion space is provided, as will be apparent. Passage of liquid 33 between the interior of sleeve 17 and the interior of casing 20 is permitted by the provision of a plurality of openings 41 in the side walls of sleeve 17 whereby a comparatively large area for the storage of fluid 33 is provided. It will be apparent that slots or the like could be provided in sleeve 17 if desired, in lieu of openings 41, since the manner of effecting fluid communication is not important.

It is particularly noted that by reason of the provision of the space for liquid between sleeve 17 and casing 20, resistor 11 may be tipped at any angle, and nevertheless the windings of resistance wire 21 remain covered with liquid 33. To enhance this characteristic, core 19, with wire 21 thereabout, is preferably arranged equidistant from the upper and lower ends of the liquid reservoirs formed by sleeve 17 and casing 20.

In operation, upon the application of an electrical potential between the terminals 16, resistance wire 21 will rise in temperature. This heating, in turn, will effect a boiling and agitation of liquid 33 about resistance wire 21 whereby heat transfer takes place between resistance wire 21 and the walls of sleeve 17. The agitating action of boiling liquid 33 is well-suited to efficient heat transfer, and the heat accumulated by sleeve 17 is next transferred to plate 12 of the chassis. Nuts 13 and 14 also serve to transfer such heat to the underside of plate 12 simultaneously with the transfer of heat by sleeve 17 to the upper side of plate 12. In this manner, resistor 11 functions to dissipate heat generated by resistance wire 21 so that resistor 11 is capable of handling higher wattages for given rises in resistance wire temperatures.

While certain preferred embodiments of the invention have been specifically disclosed, it is understood that the invention is not limited thereto as many variation will be readily apparent to those skilled in the art and the invention is to be given its broadest possible interpretation within the terms of the following claims.

I claim:

1. A heat dissipating resistor comprising a hermetically sealed housing, a resistance wire carried within said sealed housing, a double ended element disposed within said housing for supporting said resistance, said element having a bore therethrough, a first electrical conductor disposed within the bore of said element, a pair of electrically conductive members mounted, respectively, at the ends of said element, said members being provided with apertures arranged for fluid communication with the bore of said element, said resistance wire being connected between said conductive members, said first conductor being connected to one of said conductive members, a second electrical conductor, said second conductor being connected to the other of said conductive members, and liquid in said housing for cooling said resistance wire when an electrical potential is connected across said first conductor and said second conductor, said liquid being free to pass through the apertures of said conductive members and the bore of said element to thereby cool the interior of said element.

2. A heat dissipating apparatus comprising a hermetically sealed metallic housing, a resistance wire carried within said housing, an element supported within said housing and having a bore therethrough, a first electrical conductor in said bore, said element being formed to provide adjacent crests and valleys in its surface, a pair of electrically conductive members supported by said element, said resistance wire being wrapped upon said element in contact with said crests of said element and connected between said pair of conductive members, said first conductor being connected to one of said conductive members, a second electrical conductor connected to the other of said conductive members, and a cooling liquid disposed within portions of said bore and said valleys and filling at least half of the otherwise unfilled space within said housing for cooling said resistance wire when an electrical potential is connected across said first conductor and said second conductor.

References Cited in the file of this patent

UNITED STATES PATENTS

| | | |
|---|---|---|
| 1,238,124 | Frickey | Aug. 28, 1917 |
| 2,154,685 | Lamb | Apr. 18, 1939 |
| 2,274,381 | Richardson | Feb. 24, 1942 |
| 2,274,537 | Ehlert | Feb. 24, 1942 |
| 2,393,952 | Austin | Feb. 5, 1946 |

FOREIGN PATENTS

| | | |
|---|---|---|
| 570,761 | Germany | Feb. 20, 1933 |